United States Patent [19]

Freeman

[11] Patent Number: 4,608,453

[45] Date of Patent: Aug. 26, 1986

[54] ELECTRO-MAGNETIC INTERFERENCE SHIELD

[75] Inventor: Richard B. Freeman, Wilmington, Del.

[73] Assignee: The Budd Company, Troy, Mich.

[21] Appl. No.: 642,005

[22] Filed: Aug. 20, 1984

[51] Int. Cl.⁴ .............................................. H05K 9/00
[52] U.S. Cl. .............................................. 174/35 MS
[58] Field of Search ........ 361/424; 174/35 R, 35 MS; 219/10.55 D

[56] References Cited

U.S. PATENT DOCUMENTS 2,876,275 3/1959 Schulz ............................ 174/35 MS
3,246,072 4/1966 Lindgren ........................ 174/35 MS

FOREIGN PATENT DOCUMENTS 0025426 3/1981 European Pat. Off. .......... 174/35 R
1591865 6/1981 United Kingdom .......... 174/35 MS

*Primary Examiner*—Arthur T. Grimley
*Assistant Examiner*—D. A. Tone
*Attorney, Agent, or Firm*—Edward M. Farrell; Herman Foster; T. I. Davenport

[57] ABSTRACT

A non-metallic integral housing includes a plurality of fiber covered foam panels joined together. An electromagnetic shield is disposed on one surface and around the edges of the panels. The shield includes a pair of metallic foils having openings therein separated by a fibrous non-conducting material. Layers of additional fibrous material are disposed on opposite surfaces of the foils. The metallic foils with the fibrous material are disposed on the outer surfaces and around the edges of the panels where they are metallurgically joined. Resin is impregnated into the fibrous material to encapsulate the metal foils to produce an integral isolated housing with the shield within the walls of the housing.

7 Claims, 5 Drawing Figures

ELECTRO-MAGNETIC INTERFERENCE SHIELD

BACKGROUND OF THE INVENTION

In many situations, especially involving military shelters, it is desirable to have a non-metallic housing and still provide protection against electro-magnetic interference signals. Aside from the individuals within the shelters, the shelters often enclose critical electronic equipment which would malfunction if subjected to electro-magnetic waves. Also, when certain types of electronic equipment are used, it is desirable to have shelters which avoid detection of the location from which the signals are generated. In these cases, protective shields may be placed within the walls of the shelters.

Heretofore, electro-magnetic protection has been provided by using solid aluminum skins on the inside surface of the shelter, sometimes sandwiched with a fibrous skin which forms the exterior of the shelter. The locations of aluminum skins inside of the walls of the shelters produce problems because of the likelihood that the aluminum may be penetrated accidentally or otherwise, as when inserts are attached to the aluminum.

Placing thin aluminum shields on the outside of the shelters subjects them to damage and defeats a primary purpose of a non-metallic shelter which is to provide a durable, damage and environmental resistant outer skin.

Any shield employed should be capable of providing full protection for the shelter, with no openings at the corners or areas where panels are joined to form the shelter.

Some U.S. patents relating to shielding include Nos. 2,405,987; 3,231,663; 3,231,451; 3,030,435 and 4,037,009.

OBJECTS OF THE INVENTION

It is an object of this invention to provide a novel electro-magnetic interference shield for a non-metallic enclosure.

It is a further object of this invention to provide improved methods and means for molding an integral insulated enclosure.

It is still a further object of this invention to provide an improved means for joining a plurality of electro-magnetic shields to provide complete shielding inside the interior of the walls of an enclosure.

BRIEF SUMMARY OF THE INVENTION

In accordance with the present invention, an electro-magnetic shield is provided within an integral non-metallic housing or shelter. The main housing comprises a plurality of foam panels which are covered with fibrous material and dimensioned to be joined together. The shield comprises a pair of metallic foils having openings therein separated by a fibrous non-conducting material. Layers of additional fibrous material are disposed on opposite surfaces of the foils. The shields with the fibrous material are placed on the outer surfaces and around the edges of the panels. The metallic foils extend around the edges of the panels and are metallurgically joined so that the entire housing is electro-magnetically shielded. Resin is impregnated through the fibrous material and metallic foils to produce an integral isolated housing.

Other objects and advantages of the present invention will be apparent and suggest themselves to those skilled in the art, from a reading of the following specification and claims, taken in conjunction with the accompanying drawings.

DESCRIPTION OF THE INVENTION

Figure 1:
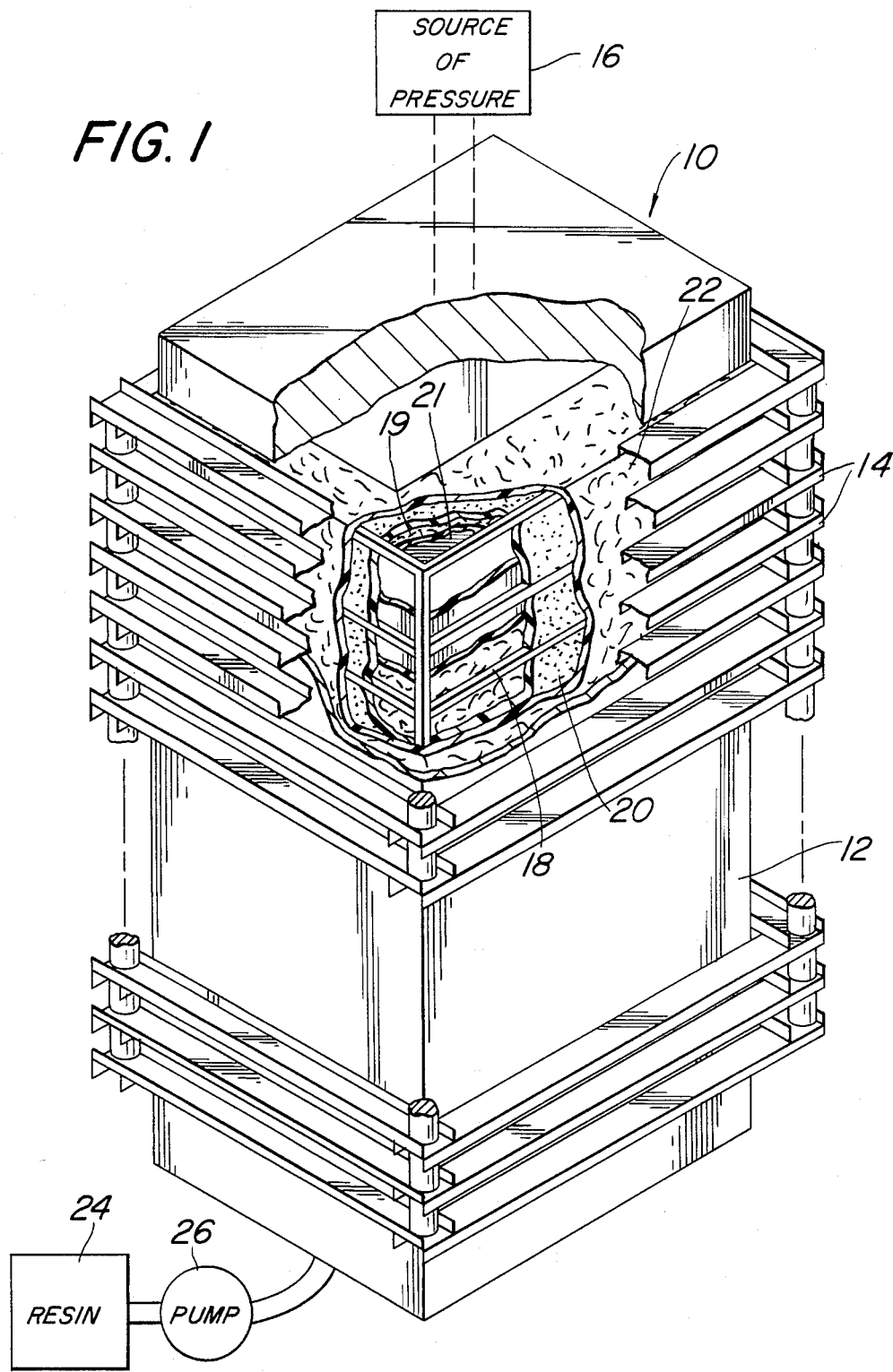
FIG. 1 illustrates a mold for forming a shelter, which utilizes an electro-magnetic shield, in accordance with the present invention.

Referring to FIG. 1, a molding system is illustrated for forming a shelter which would include the electro-magnetic interference shield of the present invention. Some of the details relating to the overall molding system are also described in a copending patent application "An Inner Inflatable and Collapsible Mold", Ser. No. 642,774, filed Aug. 20, 1984, assigned to the same assignee as the present invention.

In general, the molding system illustrated in FIG. 1 provides means for joining six individual panels to form an enclosure. Each panel consists of a foam core material, such as urethane, wrapped with a fiber material, such as fiberglass. The panels, when properly constructed, have mitered edges for subsequent nesting of the panels in the corners of the shelter.

A mold 10 includes an inner mold 21 which may be of a plastic bag type or other inflatable means, such as the one described in connection with the aforementioned patent application. An outer mold 12 comprises an aluminum shell. A plurality of individual panels, such as six, is located within the mold 12 prior to the commencement of the molding operation. Metal reinforcement means 14 are provided for the outer mold 12. Pressure, which may be air or gas, is inserted into the mold from a source 16 to inflate the inflatable means which provides the inner mold 21. The panels to be joined may include high density foam beams 18 having low density foam material 20 therebetween. The high density foam beams 18 and the foam material 20 are covered by skins 19 and 22 which comprise fiberglass cloth and an electro-magnetic shield. This arrangement will be described in detail in subsequent figures.

When all the elements are in place in the manner illustrated and pressure is being applied from the source 16, resin from a source 24 is pumped by a pump 26 impregnating all of the fiber material associated with the foam panels and encapsulating the electro-magnetic shield. The resin impregnates the outer surface of the joined panels to form a smooth integral enclosure.

Figure 2:
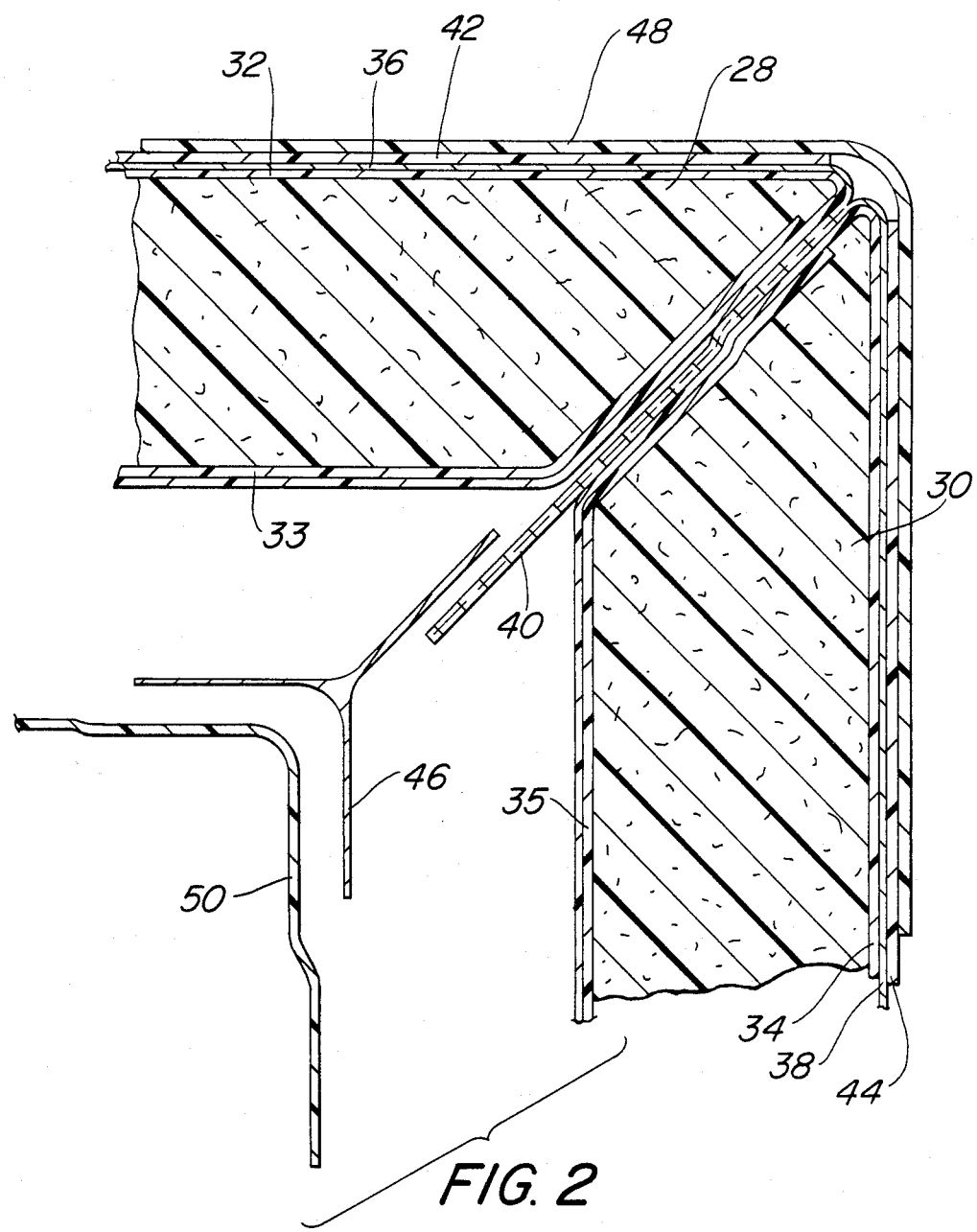
FIG. 2 illustrates a cross-sectional view of two of a plurality of panels which comprise a shelter including joined electro-magnetic shields from a number of panels prior to complete assembly.
Figure 2A:
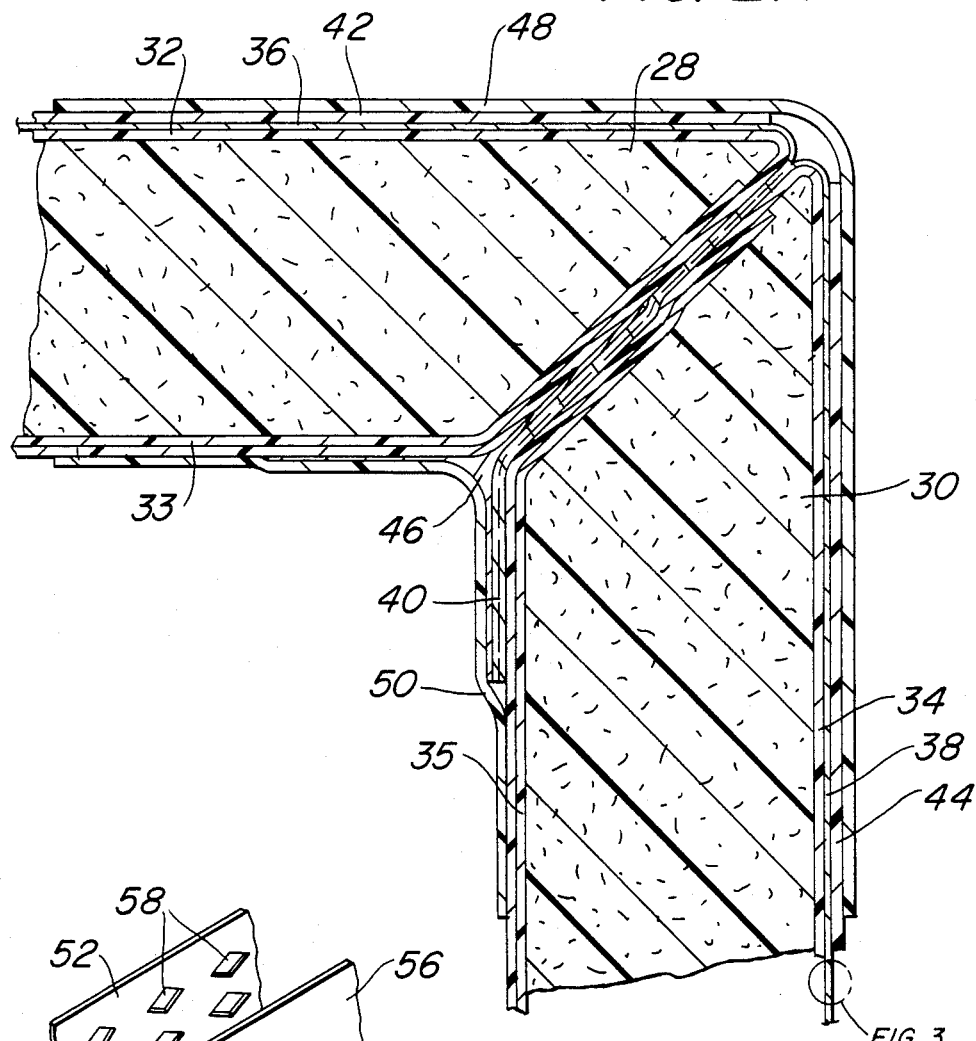
FIG. 2a is a view similar to FIG. 2 after final assembly.

Referring to FIGS. 2 and 2a, two of the foam panels making up the enclosure are illustrated. These foam panels 28 and 30 include the low and high density foam material therein with only one density being illustrated. The foam panels 28 and 30 are covered by fiberglass materials 32, 33 and 34, 35, respectively. The panels 28 and 30 are mitered so that they are joined at the corners in the manner illustrated.

Electro-magnetic shields 36 and 38 surround the external surfaces of the panels 28 and 30 and around the mitered edges of the panels in the manner illustrated in FIGS. 2 and 2a. The two shields 36 and 38 physically and electrically contact each other and provide a common connecting area 40 in which an insulating material between the metal pieces has been removed to permit metallurgical joining of the two shields 36 and 38 to in effect form a single piece. Thus, it is seen that the shielding between the panels is not interrupted at the corners of the panels.

Additional fiberglass materials 42 and 44 cover the shields 36 and 38, respectively.

FIG. 2a illustrates the final assembly in which an aluminum extrusion 46 may be inserted into the corner between the panels 28 and 30 with the metallurgically joined area 40 being folded beneath the extrusion. An outer fiberglass corner reinforcement 48 may then be applied. Likewise, an inner fiberglass corner reinforcement 50 may be applied to the inner corners of the panels. In the position illustrated in FIG. 2a, the molding system illustrated in FIG. 1 may be made operative to impregnate the various fiberglass materials by pumping resin from the source 24 into the inner and outer skins of the foam panels and through the electromagnetic shields.

Figure 4:
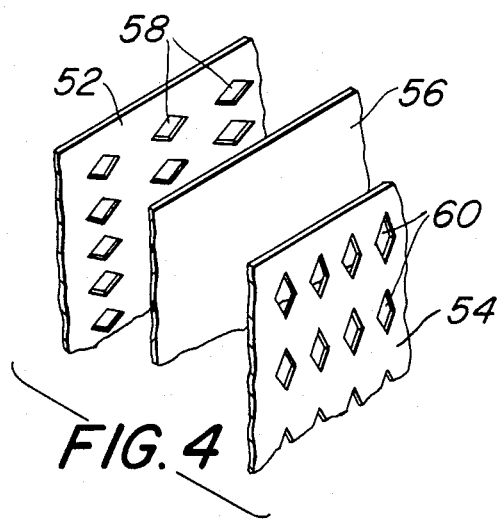
FIG. 4 is an exploded, broken-away, view illustrating the main elements of the electro-magnetic shield, in accordance with the present invention.
Figure 3:
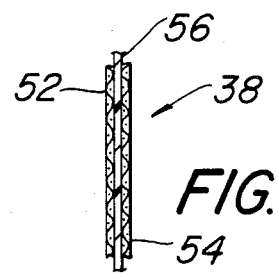
FIG. 3 is an enlarged cross-sectional view of a section in a circle in FIG. 2a, illustrating the electro-magnetic shield, in accordance with the present invention.

Referring to FIGS. 3 and 4, the electro-magnetic shield 38 comprises two metal foils 52 and 54 separated by a fibrous cloth material 56. The metallic foils 52 and 54 may be made of copper or aluminum or any other suitable metal. In a typical embodiment, each of the foils may be 0.003 inches thick. The foil 52 includes openings 58 and the foil 54 includes openings 60. A typical embodiment may involve 2000 openings per square inch in the foils 52 and 54. The openings may be somewhat diamond in shape and if so are oriented at right angles with respect to one another to maximize shielding efficiency. As mentioned, when the foils 52 and 54 are metallurgically joined at the area 40, the fibrous material 56 is removed from this area only.

A resin transfer molding process is used in the present invention. In this case, resin is injected from the source 24 to impregnate the fiberglass materials 48, 50, 32, 33, 34, 35, 42, 44 and 56, and encapsulate the metal foils 52 and 54 of the electro-magnetic shield surrounding the panels 28 and 30. The injected resin is able to penetrate through the openings in the metal foils 52 and 54 and through the fibrous material 56. Consequently, it is seen that the resin impregnates the inner and outer skins around the foam panels and the fibrous material within the electro-magnetic shield, while encapsulating the metal foils within the shield.

Because of the penetration of all of the items mentioned, a relatively hard smooth shell is provided on the interior and exterior of the shelter after the resin has cured.

It is understood that the various enclosures may include suitable openings to permit removal of the inner mold after the enclosure is formed. However, because this invention is not particularly related to such openings and means for sealing around such openings, they are omitted for purposes of clarity.

Where molded door openings exist, or where openings in a shelter are provided after molding, it is important that the continuous magnetic interference shield be maintained. At a proposed opening, a metallurgically sealed strip is preplaced, to which joining gaskets or seals may be attached with bolts or rivets thus assuring electro-magnetic interference shield continuity.

What is claimed is:

1. A shelter having electro-magnetic shielding comprising:
    (a) a plurality of panels,
    (b) a plurality of metallic sheets on the exterior surfaces of said panels and extending around the edges of said panels;
    (c) layers of fibrous material on opposite sides of each of said plurality of metallic sheets;
    (d) means for joining together and assembling said panels with said metallic sheets so that portions of said metallic sheets associated with adjacent panels extend beyond said panels inwardly into said shelter; and
    (e) said portions of said metallic sheets being metallurgically joined to provide a continuous shield around said shelter.

2. A shelter as set forth in claim 1 wherein said panels comprise foam cores wrapped with fiber reinforcement material.

3. A shelter as set forth in claim 2 wherein said metallic sheets comprise pairs of metallic sheets having openings therein separated by fibrous material in the areas contacting said exterior surfaces and edges of said panels.

4. A shelter as set forth in claim 3 wherein said layers of fibrous material, said fibrous material between said metal sheets and said fiber reinforcement material, are impregnated with resin to provide an adhesive bond therebetween and to encapsulate said metallic sheets.

5. A shelter as set forth in claim 4 wherein the opening in said pairs of metallic sheets are diamond in shape disposed at right angles with respect to each other.

6. A shelter having non-metallic interior and exterior surfaces and having electro-magnetic interference protection comprising:
    (a) a plurality of panels disposed to be joined together to form said shelter;
    (b) said panels comprising foam cores wrapped with fiber reinforcement material;
    (c) an electro-magnetic shield included within the outer skin of said shelter and around the edges of said panels;
    (d) said electro-magnetic shield comprising a pair of metallic foils having openings therein separated by a fibrous non-conducting material;
    (e) layers of fibrous material on opposite surfaces of said shield;
    (f) resin material within said layers of fibrous material and said fibrous non-conducting material to provide an adhesive bond between said cores, fiber reinforcement material, and said shield; and
    (g) the metallic foils extending around the edges of said panels being metallurgically joined to provide continuous shielding around said shelter.

7. A shelter having non-metallic interior and exterior surfaces and having electro-magnetic interference protection comprising:
    (a) a plurality of panels disposed to be joined together to form said shelter;
    (b) said panels comprising foam cores wrapped with fiber reinforcement material;
    (c) an electro-magnetic shield included within the outer skin of said shelter and around the edges of said panels;

(d) said electro-magnetic shield comprising a pair of metallic foils having openings therein separated by a fibrous non-conducting material;
(e) resin material to provide an adhesive bond between said cores, fiber reinforcement material, and said shield; and
(f) the metallic foils extending around the edges of said panels being metallurgically joined to provide continuous shielding around said shelter.

* * * * *